United States Patent
Land et al.

(10) Patent No.: US 6,577,498 B1
(45) Date of Patent: Jun. 10, 2003

(54) FULLY INTEGRATED COMPUTER RACKING SYSTEM

(75) Inventors: David Land, San Jose, CA (US); James B. Hill, San Jose, CA (US); Douglas Robinson, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/996,339

(22) Filed: Nov. 26, 2001

(51) Int. Cl.[7] ................................................. G06F 1/16
(52) U.S. Cl. ..................... 361/683; 312/223.1; 211/90.1
(58) Field of Search ........................ 211/90.01, 90.04, 211/94.01, 94.02, 94.05, 119.003, 126.1, 126.6, 126.12, 132.1, 133.1, 134, 186, 187, 188, 153, 162, 189, 190, 191, 194, 195, 206, 175, 183, 207, 208; 312/9.1, 22, 23, 25, 29, 31.1, 107, 107.5, 108, 111, 128, 129, 130, 140, 205, 257.1, 265.1, 265.2–265.6, 223.1–223.3, 223.6

(56) References Cited

U.S. PATENT DOCUMENTS

| | | | | |
|---|---|---|---|---|
| 4,681,378 A | * | 7/1987 | Hellman, III | ................ 312/108 |
| 5,094,174 A | * | 3/1992 | Grund et al. | ................. 108/50 |
| 5,746,488 A | * | 5/1998 | LaCour | ...................... 312/196 |
| 6,152,048 A | * | 11/2000 | Vander Park | ............ 108/50.02 |
| 6,185,098 B1 | * | 2/2001 | Benavides | ................. 361/695 |
| 6,394,398 B1 | * | 5/2002 | Reed et al. | ................... 248/57 |

* cited by examiner

Primary Examiner—Darren Schuberg
Assistant Examiner—Yean-Hsi Chang
(74) Attorney, Agent, or Firm—Martine & Penilla, LLP

(57) ABSTRACT

A fully integrated computer rack mount system comprising: at least one shelving unit configured to store computers; at least one electrical panel coupled to at least one of the at least one shelving unit, the at least one electrical panel configured to receive power from an external source; at least one network panel, coupled to at least one of the at least one shelving units, the at least one network panel configured to receive network connectivity from an outside source; a raceway apparatus coupled to the back plane or the front-plane of each of the at least one shelving unit, the raceway apparatus comprising a horizontal raceway and a vertical member, said vertical member comprising a power interface and a network interface; where said raceway apparatus is configured to allow each computer stored in the shelving units to be proximately connectable to the power interface and network interface; where the at least one electrical panel is coupled via said horizontal raceway to each power interface; and where the at least one network panel is coupled via said horizontal raceway to each network interface. It is emphasized that this abstract is provided to comply with the rules requiring an abstract that will allow a searcher or other reader to quickly ascertain the subject matter of the technical disclosure. It is submitted with the understand that it will not be used to interpret or limit the scope or meaning of the claims. 37 CFR 1.72(b).

19 Claims, 4 Drawing Sheets

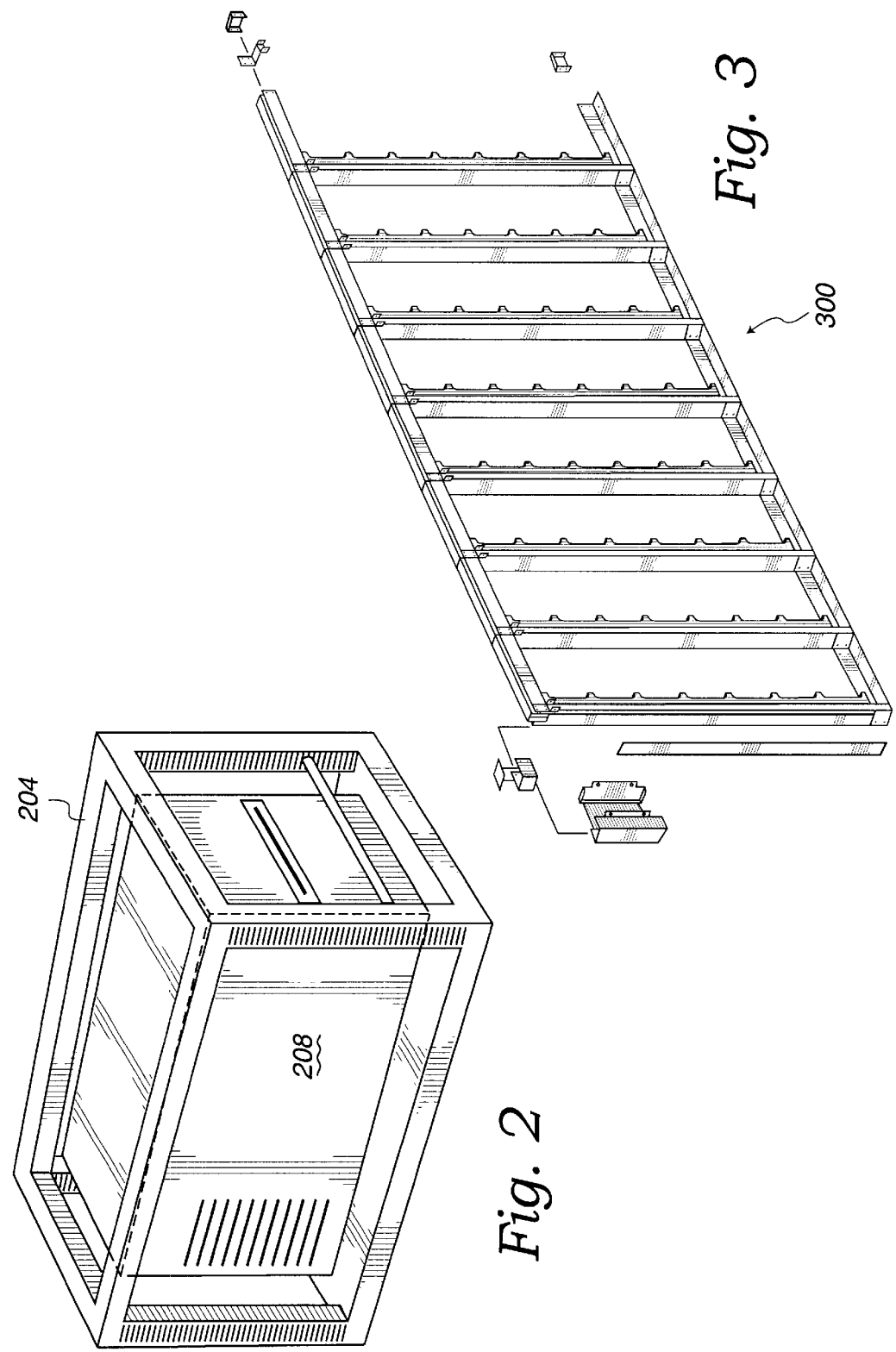

FULLY INTEGRATED COMPUTER RACKING SYSTEM

FIELD OF THE DISCLOSED SYSTEM

The present disclosed system relates to a computer racking system and method for mounting computers.

BACKGROUND OF THE DISCLOSED SYSTEM

In installations involving a plurality of computers, such as mini-tower, mid-tower, and desk top computers, the individual computers are often placed on a rack mount system, which often essentially consists of shelving units.

However, in many rack mount systems, once the system is installed, power must be routed to the computers and network connections must also be routed to the computers. Such systems may not meet electrical codes, U/L listing requirements and seismic protection requirements. Also, the power cords and network cables providing services to the computers installed on some rack mount systems often times become extremely tangled and disorganized.

A fully integrated computer rack mount system is desired which can be assembled prior to delivery, where computers to be stored on the system may easily plug into the system for power and network connectivity, where external power may need to only be provided to an electrical panel installed on the system, and where network connectivity may need to only be provided to a single network panel installed on the system. Such a system may be a "turn key" system, where the system is delivered to an end user requiring only that the computers be installed on the system, and the computers then plugged into the system, power brought to the system and network connectivity brought to the system.

SUMMARY OF THE DISCLOSED SYSTEM

The disclosed system is directed towards a fully integrated computer rack mount system comprising: at least one shelving unit configured to store computers; at least one electrical panel coupled to at least one of the at least one shelving unit, the at least one electrical panel configured to receive power from an external source; at least one network panel, coupled to at least one of the at least one shelving units, the at least one network panel configured to receive network connectivity from an outside source; a raceway apparatus coupled to the back plane or the front-plane of each of the at least one shelving unit, the raceway apparatus comprising a horizontal raceway and a vertical member, said vertical member comprising a power interface and a network interface; where said raceway apparatus is configured to allow each computer stored in the shelving units to be proximately connectable to the power interface and network interface; where the at least one electrical panel is coupled via said horizontal raceway to each power interface; and where the at least one network panel is coupled via said horizontal raceway to each network interface.

BRIEF DESCRIPTION OF THE DRAWINGS

FIG. 2 is a close up view of one shelf with an installed computer.

FIG. 3 is a drawing of the raceways.

DETAILED DESCRIPTION OF THE DISCLOSED SYSTEM

Those of ordinary skill in the art will realize that the following description of the present disclosed system is illustrative only and not in any way limiting. Other embodiments of the disclosed system will readily suggest themselves to such skilled persons.

Figure 1:
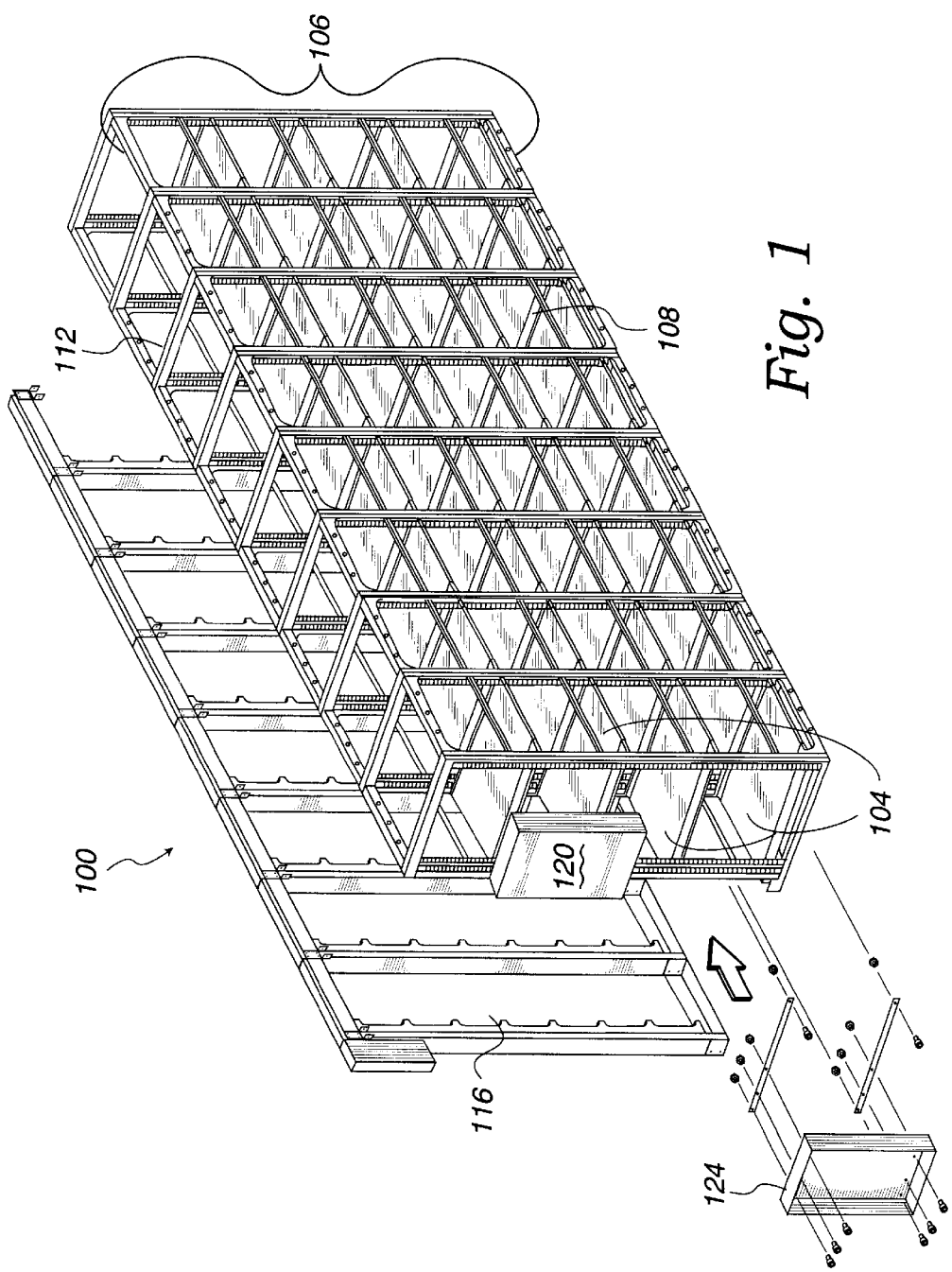
FIG. 1 is a drawing of one embodiment of the disclosed system.

Referring to FIG. 1, one embodiment of a disclosed a modular computer rack mount system 100 is shown. The system 100 may be comprised of an adjustable modular shelving system, composed of a plurality of shelves, some of which are labeled as 104. A shelving unit shall refer to a single column of shelves 106. The shelves may have a front plane 108 and back plane 112. One or more computers may be stored on the shelves 104 with the front of the computers facing the front plane 108 and the back of the computers facing the back plane 112. The system may also be composed of a raceway apparatus 116 that may be coupled to the back plane 112 of each shelving unit. In other embodiments of the disclosed system, the raceway apparatus may be coupled to the front plane of each shelving unit, or there may be a first raceway apparatus coupled to the back plane and a second raceway apparatus coupled to the front plane. The raceway apparatus allows for the neat and orderly housing of the various computer cables, including but not limited to power cords, network cables, printer cables, keyboard cables, mouse cables, monitor cables, and any other peripheral cables, going to and from the computers. The computer rack mount system may also include an electrical panel 120. Power may be supplied to this one panel from an external source, which in turn may be used to supply power to all of the computers housed in the computer rack mount system illustrated in FIG. 2.

The computer rack mount system may also include a network connection panel 124. The network connection panel may allow for network connectivity for the computers stored on the computer rack mount system.

FIG. 2 is a close up view of one shelf 204 of the shelving system from FIG. 1. A computer 208 is shown stored in the shelf 204, with the front end of the computer facing the front plane of the shelving system.

Referring to FIG. 3, another view of a raceway apparatus 300 is shown. As shown in FIG. 3, the raceway apparatus has a modular design such that segments of the raceway apparatus may be added and removed in order to match the raceway apparatus to the shelving system.

Figure 4:
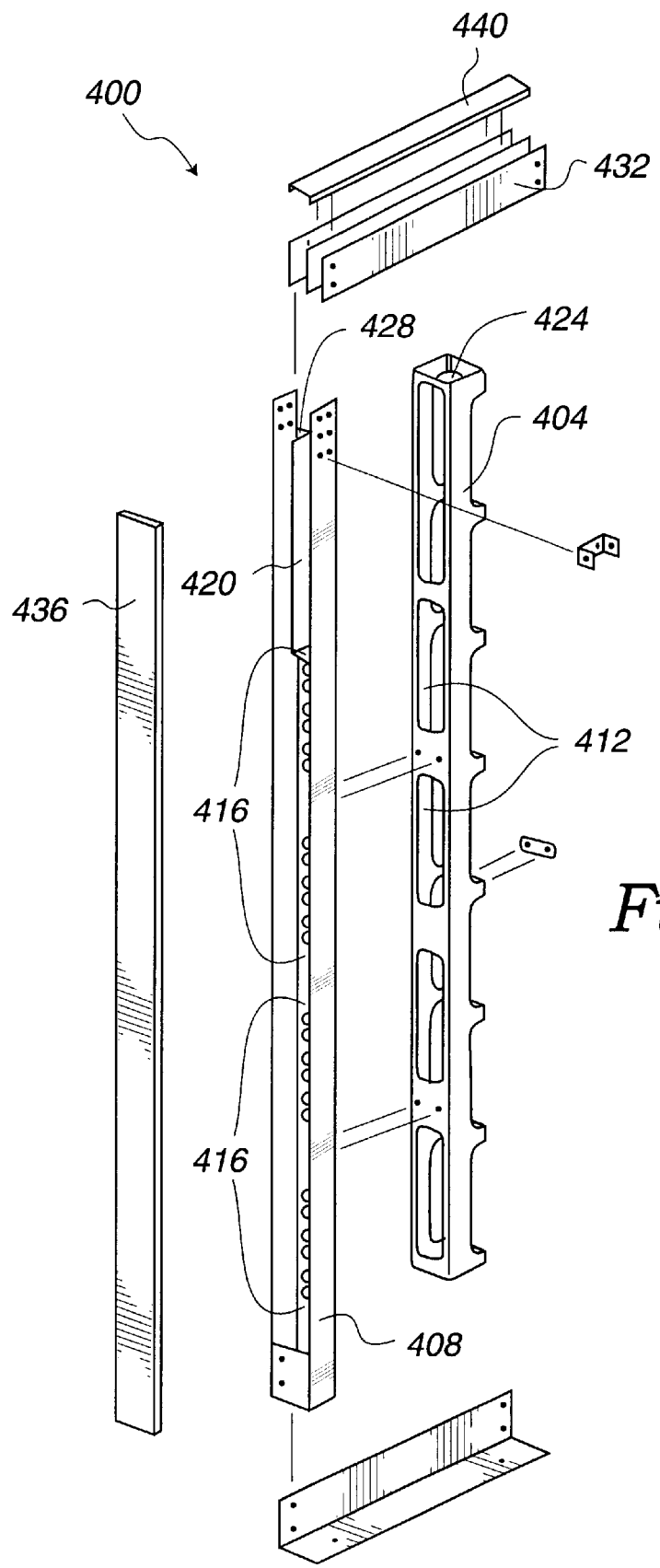
FIG. 4 is a drawing showing an exploded view of the raceways.

Referring to FIG. 4, an exploded view of a portion of one segment 400 of a raceway apparatus is shown. The raceway apparatus may be comprised of a first vertical member 404 and a second vertical member 408. First vertical member 404 contains a routing volume for the routing of the various cables associated with the computers. Vertical member 404 contain apertures 412 that allow for routing of the various cables from the components stored on the shelves to vertical member 408. Second vertical member 408 contains a plurality of electrical outlets, also referred to as electrical interfaces 416 and a plurality of network connections, also referred to as network interfaces 420. In one embodiment of the disclosed system, the components stored on the shelves have power cords routed from them through the apertures 412 of the first vertical member 404 and into the electrical outlets 416 in the second vertical member 408. Likewise the components stored on the shelves have network cables routed from them through the apertures 412 of the first vertical member 408 and into the network connections 420 in the second vertical member.

Vertical member 408 has an opening 424 at its upper end. Coupled to the upper ends of the first and second vertical members is a horizontal member 432. Horizontal member 432 may comprise one or more horizontal storage volumes for the various computer cables. Horizontal member 432 may also contain apertures at its downward facing side to allow for the routing of various cables through opening 428 from the second vertical member. In one embodiment of the disclosed system, at least one power supply cable that provides power to the electrical outlets 416, may be routed from the electrical outlets 416, through opening 428 and into horizontal member 432. The at least one power supply cable may be routed through the horizontal member and any other horizontal members coupled thereto, to the electrical panel box 120 of FIG. 1.

Similarly, at least one network cable that provides network connectivity to the network connections 420, may be routed from the network connections 420 through opening 428 and into horizontal member 432. From there, the at least one network cable may be routed through the horizontal member and any other horizontal members coupled thereto, to the network panel box 124 of FIG. 1.

The second vertical member 408 may have a cover 436. The horizontal member may have a cover 440.

Figure 5:
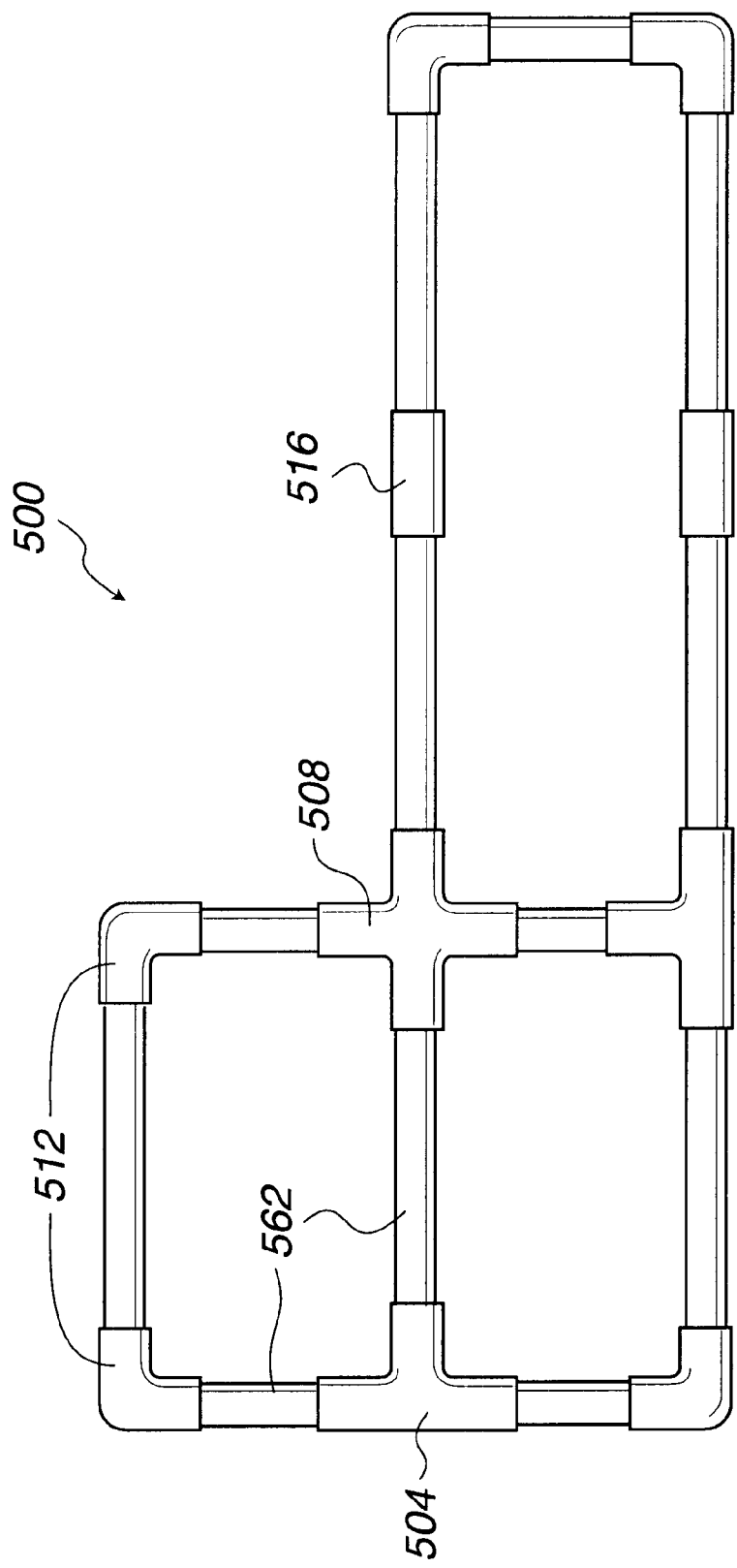
FIG. 5 is a drawing showing the top view of the horizontal raceways.

Referring to FIG. 5, a top view of one embodiment of a disclosed system 500 is shown. In this view, the horizontal raceways 502 are shown. The various horizontal raceways may be connected by "tee" connectors, 504, four-way connectors 508, corner connectors 512 and "straight thru" couplings. Thus, the various cables may run between a plurality of shelving systems.

The disclosed system may also be manufactured to be U/L listed.

The disclosed system may also be manufactured to be compliant to seismic codes.

While embodiments and applications of this disclosed system have been shown and described, it would be apparent to those skilled in the art that many more modifications than mentioned above are possible without departing from the inventive concepts herein. The disclosed system, therefore, is not to be restricted except in the spirit of the appended claims.

What is claimed is:

1. A fully integrated computer rack mount system comprising:
   at least one shelving unit configured to store computers;
   at least one electrical panel coupled to at least one of said at least one shelving unit, said at least one electrical panel configured to receive power from an external source;
   at least one network panel, coupled to at least one of said at least one shelving units, said at least one network panel configured to receive network connectivity from an outside source;
   a raceway apparatus coupled to the back plane of each of said at least one shelving unit, said raceway apparatus comprising a horizontal raceway and a vertical member, said vertical member comprising a power interface and a network interface;
   where said raceway apparatus is configured to allow each computer stored in said shelving units to be proximately connectable to said power interface and network interface;
   where said at least one electrical panel is coupled via said horizontal raceway to each power interface; and
   where said at least one network panel is coupled via said horizontal raceway to each network interface.

2. The computer rack mount system of claim 1, wherein said at least one shelving unit is adjustable.

3. The computer rack mount system of claim 1, wherein said raceway apparatus is interconnectable to raceway apparatuses of other shelving units.

4. The computer rack mount system of claim 1, wherein said system is U/L listed.

5. The computer rack mount system of claim 1, wherein said system is compliant with seismic regulations.

6. The computer rack mount system of claim 1, wherein said raceway apparatus is interconnectable to at least one other raceway apparatus with "tee" connectors.

7. The computer rack mount system of claim 1, wherein said raceway apparatus is interconnectable to at least one other raceway apparatus with four-way connectors.

8. The computer rack mount system of claim 1, wherein said raceway apparatus is interconnectable to at least one other raceway apparatus with corner connectors.

9. The computer rack mount system of claim 1, wherein said raceway apparatus is interconnectable to at least one other raceway apparatus with straight thru connectors.

10. A method of fully integrating a computer rack mount system comprising:
    configuring at least one shelving unit to store computers;
    coupling at least one electrical panel to at least one of said at least one shelving unit, said at least one electrical panel configured to receive power from an external source;
    coupling at least one network panel to at least one of said at least one shelving units, said at least one network panel configured to receive network connectivity from an outside source;
    coupling a raceway apparatus to the back plane of each of said at least one shelving unit, said raceway apparatus comprising a horizontal raceway and a vertical member, said vertical member comprising a power interface and a network interface;
    configuring said raceway apparatus to allow each computer stored in said shelving units to be proximately connectable to said power interface and network interface;
    coupling said at least one electrical panel via said horizontal raceway to each power interface; and
    coupling said at least one network panel via said horizontal raceway to each network interface.

11. The method of claim 10, wherein said at least one shelving unit is adjustable.

12. The method of claim 10, wherein said raceway apparatus is interconnectable to raceway apparatuses of other shelving units.

13. The method of claim 10, wherein said system is U/L listed.

14. The method of claim 10, wherein said system is compliant with seismic regulations.

15. The method of claim 10, wherein said raceway apparatus is interconnectable to at least one other raceway apparatus with "tee" connectors.

16. The method of claim 10, wherein said raceway apparatus is interconnectable to at least one other raceway apparatus with four-way connectors.

17. The method of claim 10, wherein said raceway apparatus is interconnectable to at least one other raceway apparatus with corner connectors.

18. The method of claim 10, wherein said raceway apparatus is interconnectable to at least one other raceway apparatus with straight thru connectors.

19. A fully integrated computer rack mount system comprising:

at least one shelving unit configured to store computers;

at least one electrical panel coupled to at least one of said at least one shelving unit, said at least one electrical panel configured to receive power from an external source;

at least one network panel, coupled to at least one of said at least one shelving units, said at least one network panel configured to receive network connectivity from an outside source;

a raceway apparatus coupled to the front plane of each of said at least one shelving unit, said raceway apparatus comprising a horizontal raceway and a vertical member, said vertical member comprising a power interface and a network interface;

where said raceway apparatus is configured to allow each computer stored in said shelving units to be proximately connectable to said power interface and network interface;

where said at least one electrical panel is coupled via said horizontal raceway to each power interface; and where said at least one network panel is coupled via said horizontal raceway to each network interface.

\* \* \* \* \*